(12) United States Patent
Jin et al.

(10) Patent No.: US 7,961,503 B2
(45) Date of Patent: Jun. 14, 2011

(54) MAGNETIC FLOATING GATE MEMORY

(75) Inventors: Insik Jin, Eagan, MN (US); Yang Li, Shoreview, MN (US); Hongyue Liu, Maple Grove, MN (US); Song S. Xue, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 162 days.

(21) Appl. No.: 12/355,908

(22) Filed: Jan. 19, 2009

(65) Prior Publication Data

US 2010/0182837 A1 Jul. 22, 2010

(51) Int. Cl.
*G11C 11/00* (2006.01)
(52) U.S. Cl. .................... 365/158; 365/185.18
(58) Field of Classification Search .............. 365/158, 365/185.18
See application file for complete search history.

(56) References Cited

U.S. PATENT DOCUMENTS

| 5,959,896 | A | 9/1999 | Forbes |
| 6,480,412 | B1 | 11/2002 | Bessho |
| 2005/0017165 | A1 | 1/2005 | Franzen |
| 2007/0155099 | A1 | 7/2007 | Takata |
| 2007/0279977 | A1 | 12/2007 | Banerjee |
| 2008/0265243 | A1 | 10/2008 | Ahn |
| 2009/0129167 | A1* | 5/2009 | Banerjee et al. ......... 365/185.18 |
| 2010/0038735 | A1* | 2/2010 | Li et al. ......................... 257/421 |

OTHER PUBLICATIONS

Cheng Kuan et al., New Magnetic Flash Memory with FePt Magnetic Floating Gate, Japanese Journal of Applied Physics, vol. 45, No. 4B, 2006, pp. 3217-3221.

* cited by examiner

*Primary Examiner* — Hoai V Ho
(74) *Attorney, Agent, or Firm* — Campbell Nelson Whipps LLC

(57) ABSTRACT

An apparatus includes at least one memory device including a floating gate element and a magnetic field generator that operably applies a magnetic field to the memory device. The magnetic field directs electrons in the memory device into the floating gate element.

13 Claims, 5 Drawing Sheets

MAGNETIC FLOATING GATE MEMORY

BACKGROUND

Field-effect transistors (FET) has been considered to be an ideal technology for nonvolatile memory because of its random access, high speed, low power, high density and simplicity. For a nonvolatile semiconductor storage device in which each memory cell is composed of an FET provided with a floating gate covered by an insulating film and used as a charge storing layer, data is stored by controlling the amount of electrons stored in the floating gate thereby changing the threshold voltage of the transistor. When programming or erasing data into or from the memory cell, electrons are either injected or ejected from the floating gate via the insulating film.

Electron injection/ejection is possible by using the (Fowler-Nordheim (F-N)) tunnel phenomenon and the hot electron phenomenon. Electrons are injected in the insulating film around the floating gate with the application of a high electrical field. In the case of hot electron injection, an electric field between a source region and drain region of a MOSFET semiconductor memory device accelerates electrons traveling between the source and drain regions to a velocity where these electrons are termed "hot" electrons. To attract these hot electrons, a floating gate of the FET is biased at a high voltage through a control gate of the FET. As the hot electrons move very fast, their travel time beneath the floating gate of the FET is too short to attract many of the hot electrons into the floating gate of the FET. Thus, electron injection via hot electron injection is not very efficient.

BRIEF SUMMARY

The present disclosure relates to magnetic floating gate memory with improved electron injection efficiency. In particular the present disclosure relates to magnetic floating gate memory that generates a magnetic field that is perpendicular to a hot electron travel direction between a source region and a drain region and perpendicular to a hot electron injection direction. The magnetic field bends the hot electron travel direction by a Lorentz's force, directing it into the floating gate of a FET through the hot electron injection direction.

A memory device includes a substrate having a source region, a drain region and a channel region. The channel region separates the source region and the drain region. Electrons flow through the channel region between the source region and the drain region in a horizontal direction. An electrically insulating layer is adjacent to the source region, drain region and channel region. A floating gate element is adjacent to the electrically insulating layer. The electrically insulating layer separates the floating gate element from the channel region. A control gate electrode is adjacent to the floating gate element. The floating gate element separates the control gate electrode from the electrically insulating layer. The channel region, electrically insulating layer, floating gate element and control gate electrode are stacked in a vertical direction. The vertical direction is perpendicular to the horizontal direction. A magnetic field is directed through the channel region and is perpendicular to the vertical direction and the horizontal direction.

One illustrative method of writing to floating gate memory device includes applying a magnetic field through a floating gate memory device to direct electrons in the device into a floating gate element of the floating gate memory device.

Another illustrative memory device includes a substrate having a source region, a drain region and a channel region. The channel region separates the source region and the drain region and electrons flow through the channel region between the source region and the drain region. An electrically insulating layer is adjacent to the source region, drain region and channel region. A floating gate element is adjacent to the electrically insulating layer, and the electrically insulating layer separates the floating gate element from the channel region. A control gate electrode is adjacent to the floating gate element. The floating gate element separates the control gate electrode from the electrically insulating layer. The channel region, electrically insulating layer, floating gate element and control gate electrode are stacked in a vertical direction. A plurality of magnetic particles are within the channel region.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to magnetic floating gate memory. The memory apparatus includes at least one memory device including a floating gate element and a magnetic field generator that operably applies a magnetic field to the memory device. The magnetic field directs electrons in the memory device into the floating gate element. In particular the present disclosure relates to magnetic floating gate memory that generates a magnetic field that is perpendicular to a hot electron travel direction between a source region and a drain region and perpendicular to a hot electron injection direction. The magnetic field bends the hot electron direction by a Lorentz's force, directing it into the floating gate of a FET. While the present disclosure is not so limited, an appreciation of various aspects of the disclosure will be gained through a discussion of the examples provided below.

Figure 1:
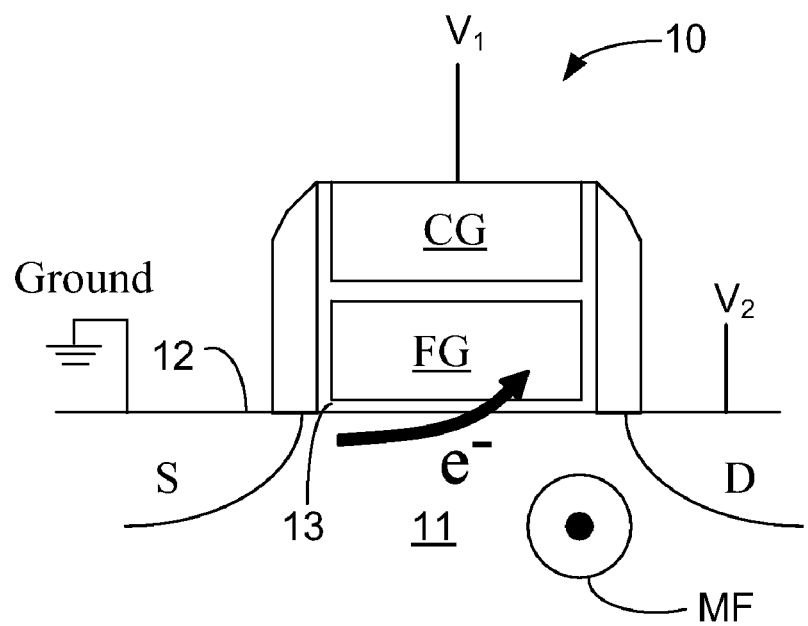
FIG. 1 is a schematic cross-sectional view of an illustrative floating gate memory device with a magnetic field directed through a channel region of the floating gate memory device.
Figure 2:
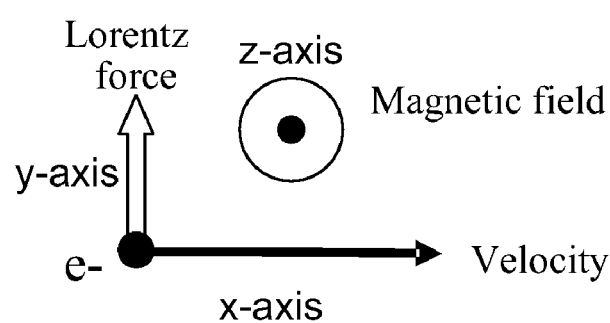
FIG. 2 is a diagram of forces acting on a hot electron in a channel region of the floating gate memory device illustrated in FIG. 1.

FIG. 1 is a schematic cross-sectional view of an illustrative floating gate memory device 10 with a magnetic field MF directed thought a channel region 11 of the floating gate memory device 10. FIG. 2 is a diagram of forces acting on a hot electron e⁻ in a channel region 11 of the floating gate memory device 10 illustrated in FIG. 1.

The memory device 10 includes a substrate 12 having a source region S, a drain region D and a channel region 11. The channel region 11 separates the source region S and the drain region D. Electrons e⁻ flow through the channel region 11 between the source region S and the drain region D in a horizontal direction (illustrated in FIG. 2 with the velocity arrow directed to the right) or along the x-axis. An electrically insulating layer 13 is adjacent to the source region S, drain region D and channel region 11. A floating gate element FG is adjacent to the electrically insulating layer 13. The electrically insulating layer 13 separates the floating gate element FG from the channel region 11. A control gate electrode CG is adjacent to the floating gate element FG. The floating gate element FG separates the control gate electrode CG from the electrically insulating layer 13. The channel region 11, electrically insulating layer 13, floating gate element FG and control gate electrode CG are stacked in a vertical direction (illustrated in FIG. 2 with the Lorentz force arrow) or along the y-axis. The vertical direction (y-axis) is perpendicular to the horizontal direction (x-axis).

A magnetic field MF is directed through the channel region 11 and perpendicular to the vertical direction (y-axis) and the horizontal direction (x-axis or hot electron travel velocity direction). The term "perpendicular" refers to ±10 degrees of 90 degrees, throughout this application. The magnetic field MF is illustrated as coming out of the page along the z-axis. The magnetic field MF generates a Lorentz force on the hot electrons e⁻ flowing from the source region S toward the drain region D when a voltage $V_1$ is applied to the control gate electrode CG and a voltage $V_2$ is applied to the drain region D. The Lorentz force alters the hot electron travel direction or trajectory, bending it toward the floating gate element FG. The Lorentz force is proportional to the electron's speed. The Lorentz force improves the efficiency of the hot electron injection rate into the floating gate element FG, thus improving the write speed of the floating gate element FG.

Figure 3:
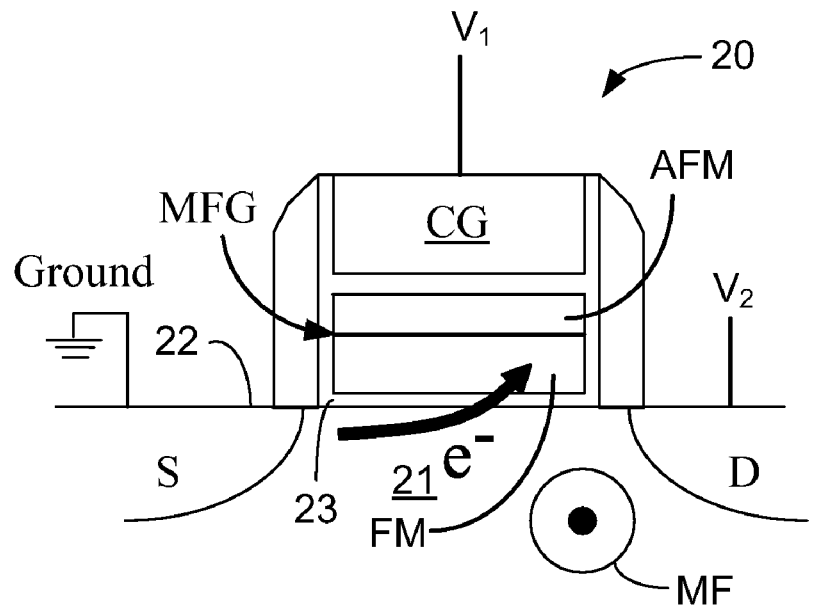
FIG. 3 is a schematic cross-sectional view of an illustrative floating gate memory device with a magnetic floating gate element.

FIG. 3 is a schematic cross-sectional view of an illustrative floating gate memory device with a magnetic floating gate element MFG. A memory device 20 includes a substrate 22 having a source region S, a drain region D and a channel region 21. The channel region 21 separates the source region S and the drain region D. Electrons e⁻ flow through the channel region 21 between the source region S and the drain region D in a horizontal direction along the x-axis (as illustrated in FIG. 2). An electrically insulating layer 23 is adjacent to the source region S, drain region D and channel region 21. A magnetic floating gate element MFG is adjacent to the electrically insulating layer 23. The electrically insulating layer 23 separates the magnetic floating gate element MFG from the channel region 21. A control gate electrode CG is adjacent to the magnetic floating gate element MFG. The magnetic floating gate element MFG separates the control gate electrode CG from the electrically insulating layer 23. The channel region 21, electrically insulating layer 23, magnetic floating gate element MFG and control gate electrode CG are stacked in a vertical direction along the y-axis (as illustrated in FIG. 2). The vertical direction (y-axis) is perpendicular to the horizontal direction (x-axis).

The magnetic floating gate element MFG generates a magnetic field MF that is directed through the channel region 21 and perpendicular to the vertical direction (y-axis) and the horizontal direction (x-axis or hot electron travel direction). The magnetic field MF is illustrated as coming out of the page along the z-axis. The magnetic field MF generates a Lorentz force on the hot electrons e⁻ flowing from the source region S toward the drain region D when a voltage $V_1$ is applied to the control gate electrode CG and a voltage $V_2$ is applied to the drain region D. The Lorentz force alters the electron trajectory, bending it toward the floating gate element FG. The Lorentz force is proportional to the electron's speed. The Lorentz force improves the efficiency of the hot electron injection rate into the floating gate element FG, thus improving the write speed of the floating gate element FG.

The magnetic floating gate element MFG includes a ferromagnetic layer FM that generates the magnetic field MF described above. The ferromagnetic layer FM can be located proximate to the channel region 21. The ferromagnetic layer FM can be formed of any useful ferromagnetic material or alloy such as, for example, Fe, Co, and/or Ni. In many embodiments the ferromagnetic layer FM is located a linear distance of less than 200 Angstroms, or less than 100 Angstroms, or less than 50 Angstroms from the channel region 21. In many of these embodiments, the control gate electrode CG is a non-magnetic element.

In some embodiments the magnetic floating gate element MFG also includes an antiferromagnetic pinning layer AFM to assist in stabilizing the magnetic field MF generated by the ferromagnetic layer FM. The antiferromagnetic pinning layer AFM can be formed of any useful antiferromagnetically ordered material such as, for example, PtMn, IrMn and others. In other embodiments the magnetic floating gate element MFG includes a synthetic antiferromagnetic element or a synthetic antiferromagnetic and an antiferromagnetic pinning layer.

Figure 4:
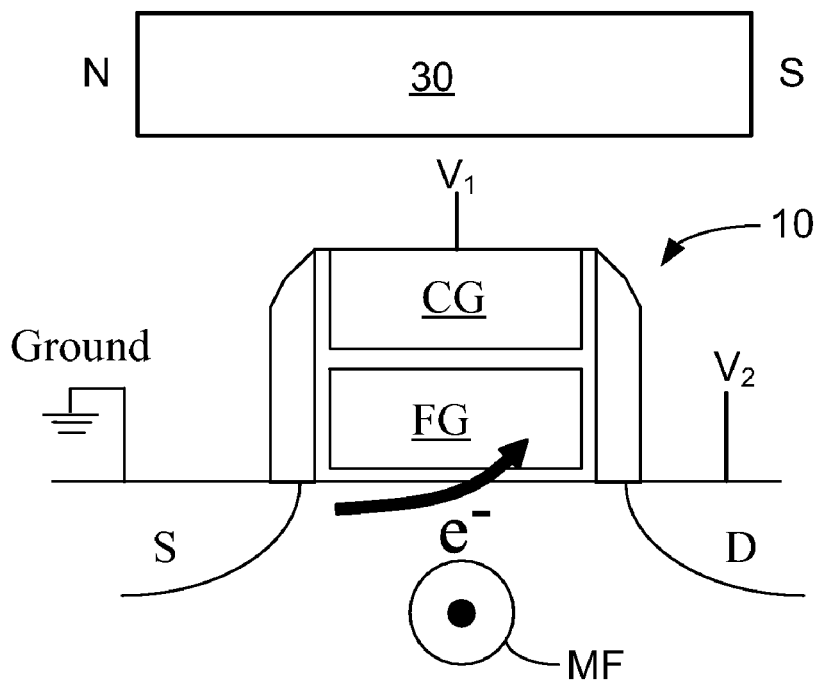
FIG. 4 is a schematic cross-sectional view of an illustrative floating gate memory device with an adjacent magnetic element.

FIG. 4 is a schematic cross-sectional view of an illustrative floating gate memory device 10 with an adjacent magnetic element 30. The floating gate memory device 10 is described in relation to FIG. 1 and FIG. 2 above. A magnetic element 30 generates the magnetic field MF through the channel region and perpendicular to the vertical direction (y-axis) and the horizontal direction (x-axis or hot electron travel direction), as described above. The magnetic element 30 can be any useful magnetic element such as, for example, a permanent magnetic (as illustrated with a North Pole N and a South Pole S). The adjacent magnetic element 30 is proximate to the floating gate memory device 10 but separate from the floating gate memory device 10 so that the magnetic element 30 generates the magnetic field MF through the channel region of the floating gate memory device 10. The magnetic element 30 can be thick enough to produce a strong fringe magnetic field, and can be a soft magnetic layer stabilized with an antiferromagnetic pinning layer and/or synthetic antiferromagnetic element, as described above.

Figure 5:
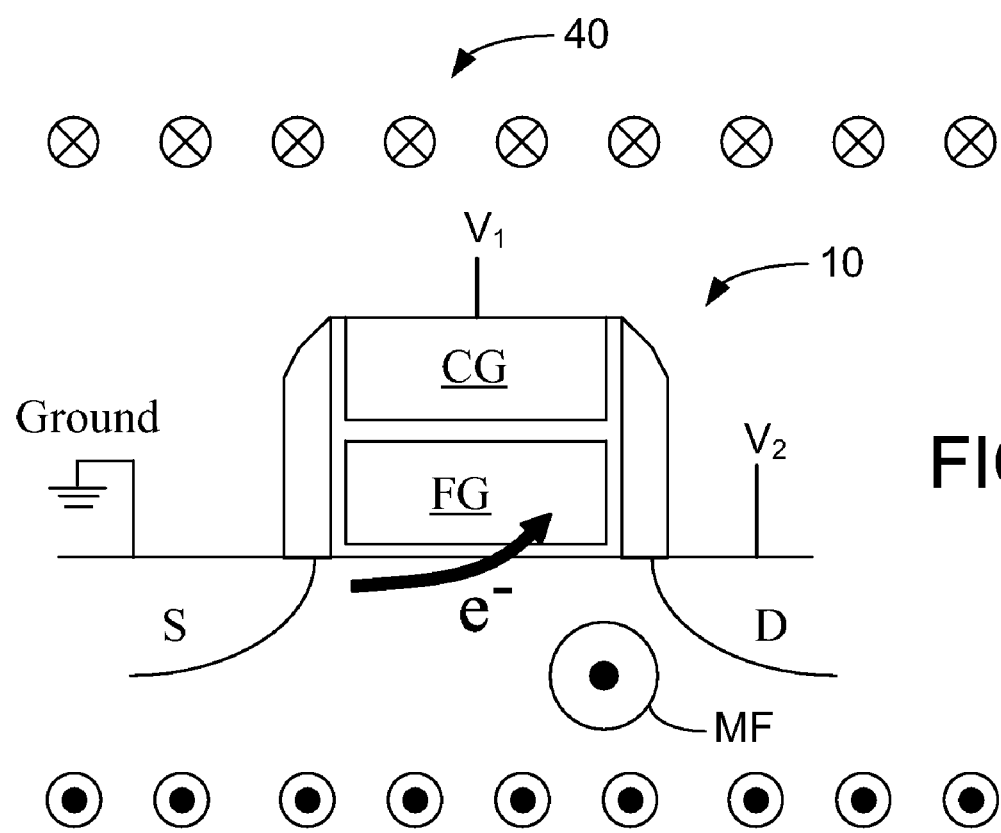
FIG. 5 is a schematic cross-sectional view of an illustrative floating gate memory device with an adjacent magnetic field generating electric coil.

FIG. 5 is a schematic cross-sectional view of an illustrative floating gate memory device 10 with an adjacent magnetic field generating electric coil 40. The floating gate memory device 10 is described in relation to FIG. 1 and FIG. 2 above. The electric coil 40 generates the magnetic field MF through the channel region and perpendicular to the vertical direction (y-axis) and the horizontal direction (x-axis or hot electron travel direction), as described above. The electric coil 40 can be formed of any useful electrically conductive wire, with or without high permeability core layers. The electric coil 40 is proximate to the floating gate memory device 10 but separate from the floating gate memory device 10 so that the electric coil 40 generates the magnetic field MF through the channel region of the floating gate memory device 10. The electric coil 40 is illustrated as a plurality of wire winding directed into the page above the floating gate memory device 10 and directed out of the page below the floating gate memory device 10.

Figure 6:
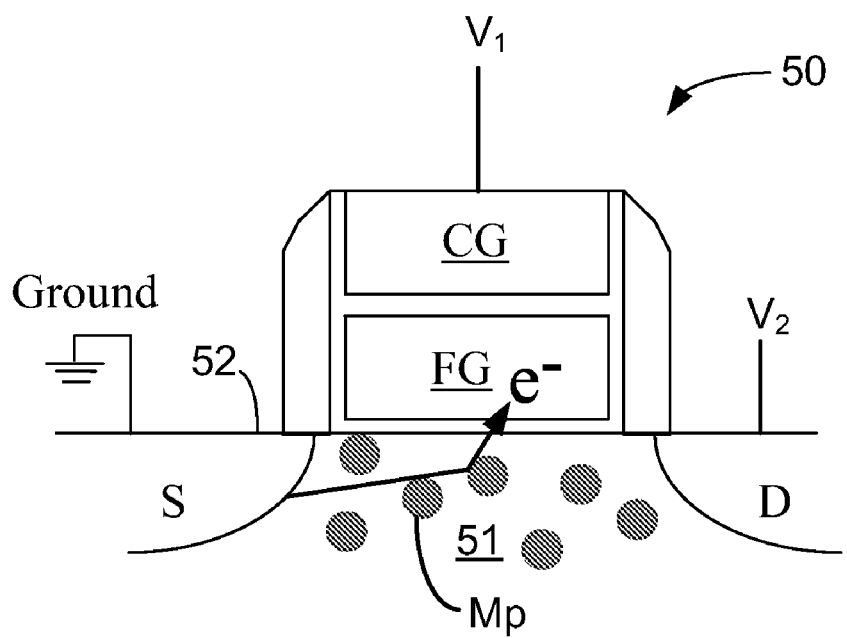
FIG. 6 is a schematic cross-sectional view of an illustrative floating gate memory device with magnetic particles in a channel region of a floating gate memory device.

FIG. 6 is a schematic cross-sectional view of an illustrative floating gate memory device with magnetic particles $M_P$ in a channel region 51 of a floating gate memory device 50. The memory device 50 includes a substrate 52 having a source region S, a drain region D and a channel region 51. The channel region 51 separates the source region S and the drain region D. Electrons e⁻ flow through the channel region 51 between the source region S and the drain region D in a horizontal direction (illustrated with the velocity arrow directed to the right) or along the x-axis (as illustrated in FIG. 2). An electrically insulating layer is adjacent to the source region S, drain region D and channel region 51. A floating gate element FG is adjacent to the electrically insulating layer. The electrically insulating layer separates the floating gate element FG from the channel region 51. A control gate electrode CG is adjacent to the floating gate element FG. The floating gate element FG separates the control gate electrode CG from the electrically insulating layer. The channel region 51, electrically insulating layer, floating gate element FG and control gate electrode CG are stacked in a vertical direction along the y-axis (as illustrated in FIG. 2). The vertical direction (y-axis) is perpendicular to the horizontal direction (x-axis).

A plurality of magnetic particles $M_P$ are disposed within the channel region 51 of a floating gate memory device 50. The magnetic particles $M_P$ have an average lateral size in a range from 1 to 6 nanometers or from 2 to 5 nanometers. The magnetic particles $M_P$ can be formed of any useful ferromagnetic material such as, for example, nickel or cobalt. The magnetic particles $M_P$ can be doped into the channel region 51 of floating gate memory device 50 substrate 52 using known semiconductor fabrication doping methods.

The magnetic particles $M_P$ generate local magnetic fields that apply a Lorentz force on hot electrons passing thorough the channel region 51 that alters the hot electron travel direction or trajectory, bending it toward the floating gate element FG. The Lorentz force is proportional to the electron's speed. The Lorentz force improves the efficiency of the hot electron injection rate into the floating gate element FG, thus improving the write speed of the floating gate element FG.

Figure 7:
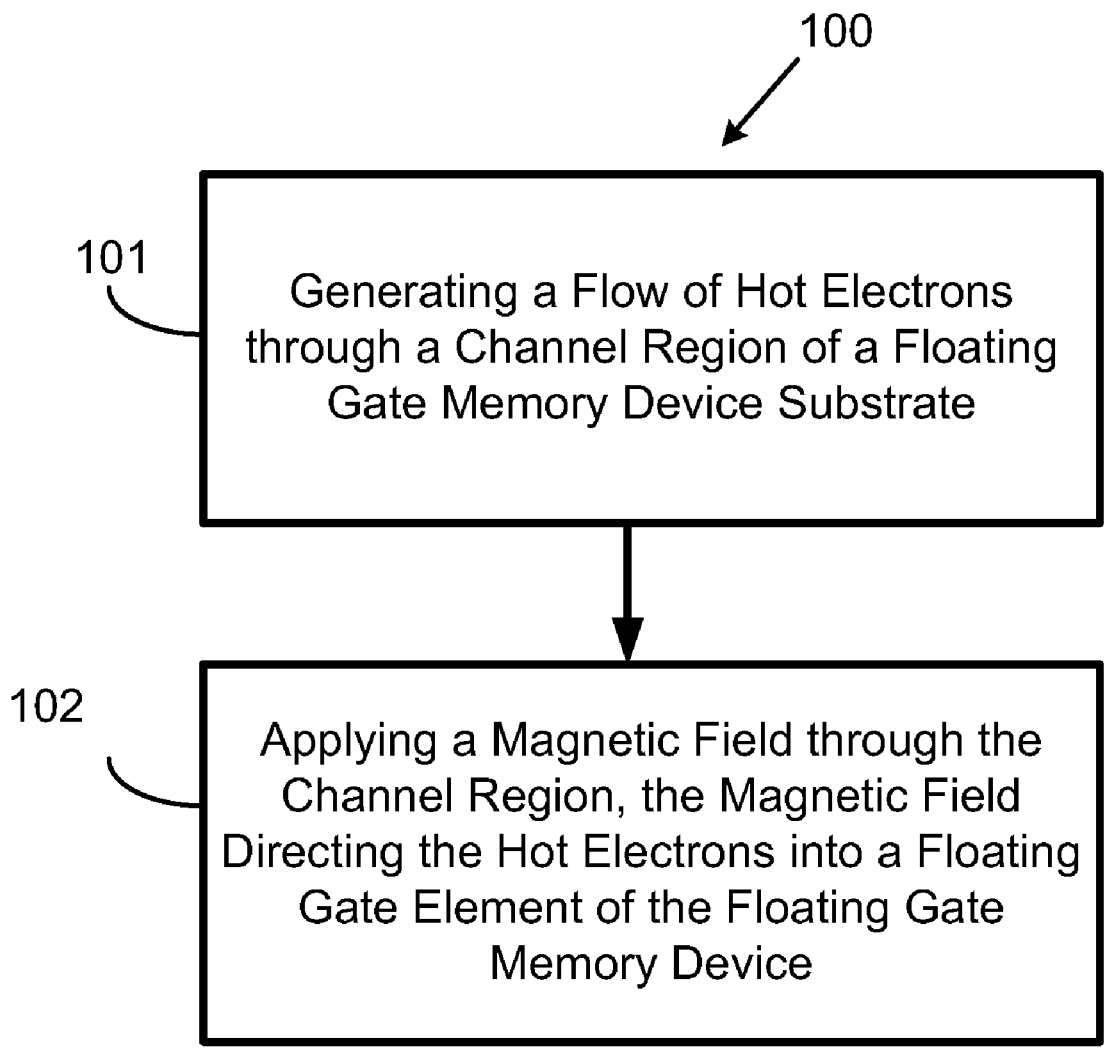
FIG. 7 is a flow diagram of an illustrative method for writing to a floating gate memory device.

FIG. 7 is a flow diagram of an illustrative method for writing to a floating gate memory device 100. The method includes generating a flow of hot electrons through a channel region of a floating gate memory device substrate, at block 101. Then the method includes applying a magnetic field through the channel region, the magnetic field directing the hot electrons into a floating gate element of the floating gate memory device.

Thus, embodiments of the MAGNETIC FLOATING GATE MEMORY are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A memory device comprising:
a substrate having a source region, a drain region and a channel region, the channel region separates the source region and the drain region, electrons flow through the channel region between the source region and the drain region in a horizontal direction;
an electrically insulating layer adjacent to the source region, drain region and channel region;
a floating gate element adjacent to the electrically insulating layer, the electrically insulating layer separates the floating gate element from the channel region, the floating gate element is magnetic and comprises a ferromagnetic pinned layer and an anti-ferromagnetic pinning layer, the floating gate element generates the magnetic field and the control gate electrode is non-magnetic;
a control gate electrode adjacent to the floating gate element, the floating gate element separates the control gate electrode from the electrically insulating layer, the channel region, electrically insulating layer, floating gate element and control gate electrode being stacked in a vertical direction, the vertical direction being perpendicular to the horizontal direction; and
a magnetic field directed through the channel region and perpendicular to the vertical direction and the horizontal direction.

2. A memory device according to claim 1, wherein the magnetic field alters an electron trajectory toward the floating gate element.

3. A memory device according to claim 1, wherein the floating gate element comprises a synthetic anti-ferromagnetic element.

4. A memory device according to claim 1, wherein the floating gate element is less than 100 Angstroms from the channel region.

5. A memory device according to claim 1, wherein the magnetic field is formed by a magnetic element, the magnetic element is adjacent to the memory device.

6. A memory device according to claim 1, wherein the magnetic field is formed by an electrically conductive coil, the electrically conductive coil is adjacent to the memory device.

7. A memory device according to claim 5, wherein the magnetic element is adjacent to, but separated from the control gate electrode.

8. A method of writing to floating gate memory device, comprising:

applying a magnetic field through a floating gate memory device to direct electrons in the device into a floating gate element of the floating gate memory device;

wherein the magnetic field is generated by a magnetic floating gate element comprising a ferromagnetic pinned layer and an anti-ferromagnetic pinning layer and the control gate electrode is non-magnetic.

9. A method according to claim 8, wherein the magnetic field is generated by a magnetic floating gate element comprising a synthetic anti-ferromagnetic element.

10. A method according to claim 8, wherein the magnetic floating gate element is less than 100 Angstroms from a channel region in the floating gate memory device.

11. A method according to claim 8, wherein the magnetic field is generated by a magnetic element, the magnetic element is adjacent to the memory device.

12. A method according to claim 8, wherein the magnetic field is generated by an electrically conductive coil, the electrically conductive coil is adjacent to the memory device.

13. A method according to claim 11, wherein the magnetic element is adjacent to, but separated from a control gate electrode of the floating gate memory device.

* * * * *